(12) United States Patent
Keshavan et al.

(10) Patent No.: US 8,561,731 B2
(45) Date of Patent: Oct. 22, 2013

(54) HARDMETAL FOR USE IN OIL AND GAS DRILLING APPLICATIONS

(75) Inventors: Madapusi K. Keshavan, The Woodlands, TX (US); Dah-Ben Liang, The Woodlands, TX (US)

(73) Assignee: Smith International, Inc., Houston, TX (US)

( * ) Notice: Subject to any disclaimer, the term of this patent is extended or adjusted under 35 U.S.C. 154(b) by 246 days.

(21) Appl. No.: 12/566,428

(22) Filed: Sep. 24, 2009

(65) Prior Publication Data

US 2011/0168454 A1    Jul. 14, 2011

Related U.S. Application Data

(60) Provisional application No. 61/099,906, filed on Sep. 24, 2008.

(51) Int. Cl.
*E21B 10/36*    (2006.01)

(52) U.S. Cl.
USPC ............. 175/428; 175/374; 175/425; 75/236

(58) Field of Classification Search
USPC ............. 175/374, 426, 425, 428, 434, 420.1, 175/420.2; 75/236, 239, 240
See application file for complete search history.

(56) References Cited

U.S. PATENT DOCUMENTS

| | | | |
|---|---|---|---|
| 4,407,775 A | 10/1983 | Holman, Jr. et al. | |
| 5,290,507 A | 3/1994 | Runkle | |
| 5,880,382 A * | 3/1999 | Fang et al. | 75/236 |
| 6,090,343 A * | 7/2000 | Kear et al. | 419/45 |
| 6,197,084 B1 | 3/2001 | Liang | |
| 6,655,478 B2 | 12/2003 | Liang et al. | |
| 6,913,827 B2 | 7/2005 | George et al. | |
| 6,934,600 B2 | 8/2005 | Jang et al. | |
| 6,949,216 B2 * | 9/2005 | Brice et al. | 264/401 |
| 7,017,677 B2 | 3/2006 | Keshavan et al. | |
| 7,036,614 B2 | 5/2006 | Liang et al. | |
| 7,128,773 B2 | 10/2006 | Liang et al. | |
| 7,300,684 B2 | 11/2007 | Boardman et al. | |
| 7,601,294 B2 * | 10/2009 | Ripley et al. | 266/202 |
| 2003/0012951 A1 | 1/2003 | Clarke et al. | |
| 2003/0111272 A1 | 6/2003 | Liang et al. | |
| 2004/0029706 A1 | 2/2004 | Barrera et al. | |
| 2004/0140132 A1 | 7/2004 | Middlemiss | |
| 2004/0140133 A1 * | 7/2004 | Liang | 175/428 |

(Continued)

FOREIGN PATENT DOCUMENTS

| EP | 1619265 A1 | 1/2006 |
|---|---|---|
| WO | 2005116291 A2 | 12/2005 |

(Continued)

OTHER PUBLICATIONS

ISSN 1392-1320, Material Science, vol. 9, No. 3, 2003.*

(Continued)

*Primary Examiner* — Yong-Suk (Philip) Ro
(74) *Attorney, Agent, or Firm* — Osha Liang LLP

(57) ABSTRACT

A down hole drill bit is disclosed that includes a plurality of cutting elements mounted on a cutting structure. At least one of the plurality of cutting elements comprises a wear resistant material, the wear resistant material comprising coarse grains disposed in a binder matrix phase, wherein the binder matrix phase comprises nanoparticles uniformly dispersed therein.

16 Claims, 6 Drawing Sheets

(56) References Cited

U.S. PATENT DOCUMENTS

| | | |
|---|---|---|
| 2004/0206470 A1 | 10/2004 | Bayazitoglu |
| 2006/0093859 A1 | 5/2006 | Konyashin et al. |
| 2007/0151769 A1* | 7/2007 | Slutz et al. .................. 175/426 |
| 2008/0073127 A1 | 3/2008 | Zhan et al. |
| 2008/0179104 A1 | 7/2008 | Zhang et al. |
| 2008/0210473 A1 | 9/2008 | Zhang et al. |

FOREIGN PATENT DOCUMENTS

| | | |
|---|---|---|
| WO | 2006096641 A1 | 9/2006 |
| WO | 2006096659 A2 | 9/2006 |
| WO | 2010036569 A2 | 4/2010 |

OTHER PUBLICATIONS

International Search Report with Written Opinion issued in corresponding International Application No. PCT/US2009/057425 dated May 6, 2010 (11 pages).

Konyashin et al. Hardmetals with nanograin reinforced binder: Binder fine structure and hardness; International Journal of Refractory Metals & Hard Materials 26, pp. 583-588 (2008).

Konyashin et al., Novel ultra-courase hardmetal grades with reinforced binder for mining and construction; International Journal of Refractory Metals & Hard Materials, 23, pp. 225-232 (2005).

Office Action cited in corresponding United Kingdom Application No. GB1102653.1 on Mar. 15, 2012 (2 pages).

* cited by examiner

HARDMETAL FOR USE IN OIL AND GAS DRILLING APPLICATIONS

CROSS-REFERENCE TO RELATED APPLICATIONS

This application claims priority, under 35 U.S.C. §119(e), to U.S. Patent Application No. 61/099,906, filed on Sep. 24, 2008, which is assigned to the present assignee and herein incorporated by reference in its entirety.

BACKGROUND OF INVENTION

1. Field of the Invention

Embodiments disclosed herein relate generally to hardmetal composite materials used in drill bits.

2. Background Art

Conventional drilling systems used in the oil and gas and mining industries to drill wellbores through earth formations include a drilling rig used to turn a drill string which extends downward into a well bore. A drill bit is typically connected to the distal end of the drill string and is designed to break up earth formation in its path when rotated under an applied load. Typically, drilling fluid or air is pumped through the drill pipe and drill bit to move cuttings away from the bit during drilling and up an annulus formed between the drill string and the borehole wall.

Drill bits used to drill wellbores through earth formations generally are made within one of two broad categories of bit structures. Drill bits in the first category are generally known as "fixed cutter" or "drag" bits, which usually include a bit body formed from steel or another high strength matrix material (e.g., tungsten carbide) and a plurality of cutting elements disposed at selected positions about the bit body. The cutting elements are typically formed with a diamond or other ultra-hard cutting layer disposed on a tungsten carbide substrate.

Drill bits of the second category are typically referred to as "roller cone" bits, which include a bit body having one or more roller cones rotatably mounted to the bit body. The bit body is typically formed from steel or another high strength material. The roller cones are also typically formed from steel or other high strength material and include a plurality of cutting elements disposed at selected positions about the cones. The cutting elements may be formed from the same base material as is the cone. These bits are typically referred to as "milled tooth" bits. Other roller cone bits include "insert" cutting elements that are press (interference) fit into holes formed and/or machined into the roller cones. The inserts may be formed from, for example, tungsten carbide, natural or synthetic diamond, boron nitride, or any one or combination of hard or superhard materials.

Most cutting elements include a substrate of tungsten carbide, a hard material, interspersed with a binder component, preferably cobalt, which binds the tungsten carbide particles together. When used in drilling earth formations, the primary contact between the tungsten carbide cutting element and the earth formation being drilled is the outer end of the cutting element. Breakage or wear of the inserts, among other factors, limits the longevity of a drill bit. Inserts used with a drill bit are generally subjected to high wear loads from contact with a borehole wall, as well as high stresses due to bending and impact loads from contact with a borehole bottom. The high wear loads can also cause thermal fatigue in the inserts, which initiates surface cracks on the inserts. These cracks are further propagated by a mechanical fatigue mechanism that is caused by the cyclical bending stresses and/or impact loads applied to the inserts. Fatigue cracks may result in chipping, breakage and failure of inserts. Tungsten carbide cutting elements may also fail by excessive wear because of their softness.

Many different types of tungsten carbides are known based on their different chemical compositions and physical structure. Of the various types of tungsten carbide commonly used in drill bits, cemented tungsten carbide (also known as sintered tungsten carbide) is typically used in cutting elements for drill bits. Cemented tungsten carbide refers to a material formed by mixing particles of tungsten carbide, typically monotungsten carbide, and particles of cobalt or other iron group metal, and sintering the mixture. In a typical process for making cemented tungsten carbide, small tungsten carbide particles and cobalt particles are vigorously mixed with a small amount of organic wax which serves as a temporary binder. An organic solvent may be used to promote uniform mixing. The mixture may be then be pressed into solid bodies often referred to as green compacts. Such green compacts are then heated in a vacuum furnace to first evaporate the wax and then to a temperature near the melting point of cobalt (or the like) to cause the tungsten carbide particles to be bonded together by the metallic phase.

In general, cemented tungsten carbide grades are primarily made in consideration of two factors that influence the lifetime of a tungsten carbide insert: wear resistance and toughness. As a result, conventional tungsten carbide grades used for cutting elements of downhole drilling tools have cobalt contents of 6% to 16% by weight and tungsten carbide "relative" particle size numbers of 3 to 6 (which equates to an average tungsten carbide grain sizes of less than 3.0 microns (μm), as measured by the ASTM E-112 method). These conventional grades typically have a Rockwell A hardness of between 85 and 91 Ra, a fracture toughness below 17 $ksi(in)^{0.5}$ (as measured by the ASTM B-771 method) and a wear number between 1.8 to 5.0 (as measured by the ASTM B-611 method). In particular, these grades are widely used for inserts forming interior rows on roller cone bits.

For a WC/Co system, it is typically observed that the wear resistance increases as the grain size of tungsten carbide or the cobalt content decreases. On the other hand, the fracture toughness increases with larger grains of tungsten carbide and greater percentages of cobalt. Thus, fracture toughness and wear resistance (i.e., hardness) tend to be inversely related: as the grain size or the cobalt content is decreased to improve wear resistance of a specimen, its fracture toughness will decrease, and vice versa.

Due to this inverse relationship between fracture toughness and wear resistance, the grain size of tungsten carbide and cobalt content are selected to obtain desired wear resistance and toughness. For example, a higher cobalt content and larger WC grains are used when a higher toughness is required, whereas a lower cobalt content and smaller WC grain are used when a better wear resistance is desired. The inverse relationship between toughness and wear for carbide composites having varying particle size and cobalt content is shown in FIG. 1.

Gage row inserts are often selected to have a higher wear number than interior row inserts because it is generally believed that gage inserts need higher wear resistance due to the large amount of borehole wall contact they encounter during drilling. As a result, the toughness of gage inserts is typically sacrificed to gain wear resistance. However, this practice improperly assumes that the rock to be drilled by the gage inserts generally has the same properties in every application. In many applications, this is not the case and this practice has led to the breakage of gage inserts with the interior rows still intact.

For example, when drilling softer formations, such as carbonates, the wear resistance of inserts is not the major concern because these formations are not very abrasive. Rather, resistance to thermal fatigue and heat checking has been found to be the primary concerns that result in premature cracking and breakage of inserts. This occurs because the tungsten carbide inserts of a rock bit are subjected to high wear loads from contact with a borehole wall, as well as high stresses due to bending and impact loads from contact with the borehole bottom. These high wear loads can lead to thermal fatigue of the inserts which, in turn, leads to the initiation of surface cracks (referred to as heat checking) on inserts. These surface cracks are then propagated by a mechanical fatigue mechanism caused by the cyclical bending stresses and/or impact loads applied to the inserts during drilling. The result is chipping, breakage, and/or failure of inserts which shortens the useful life of the drill bit.

In particular for roller cone drill bits, inserts that cut the corner of a borehole bottom are often subjected to the greatest amounts of thermal fatigue due to heat generation on the inserts from a heavy frictional loading component produced as the inserts engage the borehole wall and slide into their bottom-most crushing position. As the cone rotates, the inserts retract from the borehole wall and are quickly cooled by circulating drilling fluid. This repetitive heating and cooling cycle can lead to the initiation of surface cracks on the inserts (i.e., heat checking). These cracks are then propagated through the body of the insert as the insert repeatedly impacts the borehole wall and high stresses develop.

The time required to progress from heat checking to chipping, and eventually, to breakage of inserts depends upon several factors including the formation type, rotation speed of the bit, and applied weight on bit. In many applications, especially those involving higher rotational speeds and/or higher weights on bit, thermal fatigue and heat checking of inserts are issues that have not been adequately addressed. Consequently, inserts made of standard tungsten carbide grades have been found to frequently fail in these applications.

To help reduce insert failures caused by thermal fatigue and heat checking, coarser grain carbide grades have been proposed for cutting elements of drill bits. Examples of grades proposed are further described in U.S. Pat. No. 6,197,084, U.S. Pat. No. 6,655,478, U.S. Pat. No. 7,017,677, U.S. Pat. No. 7,036,614, U.S. Pat. No. 7,128,773, and U.S. Publication No. 2004/0140133 A1, which are all assigned to the assignee of the present invention and incorporated herein by reference. These grades comprise coarse carbide grains having average grain sizes greater than 3.0 μm and binder contents of 6 to 16% by weight. Inserts formed from these composite materials have been found to exhibit higher fracture toughness and adequate wear resistance for many drilling applications. These inserts have been shown to result in improved performance and/or longevity when compared to inserts formed of conventional carbide grades. In particular, coarser grain composites have been found to be particularly useful in reducing gage carbide failures due to heat checking. However, high wear resistance is sacrificed.

Accordingly, there exists a continuing need for improvements in materials that possess both increased toughness and wear resistance.

SUMMARY OF INVENTION

In one aspect, embodiments disclosed herein relate to a down hole drill bit that includes a plurality of cutting elements mounted on a cutting structure, wherein at least one of the plurality of cutting elements comprises a wear resistant material, the wear resistant material comprising coarse grains disposed in a binder matrix phase, wherein the binder matrix phase comprises nanoparticles dispersed therein.

In another aspect, embodiments disclosed herein relate to a drill bit that includes a bit body having a plurality of blades extending radially therefrom; and a plurality of cutting elements mounted on the plurality of blades, wherein the bit body comprises coarse carbide grains disposed in a binder matrix phase, wherein the binder matrix phase comprises nanoparticles dispersed therein.

In another aspect, embodiments disclosed herein relate to a drill bit that includes a bit body having a plurality of blades extending radially therefrom; a plurality of cutting elements mounted on the plurality of blades; and a hardfacing disposed on at least a portion of the bit body, the hardfacing comprising coarse carbide grains disposed in a binder matrix phase, wherein the binder matrix phase comprises nanoparticles dispersed therein.

In yet another embodiment, embodiments disclosed herein relate to a drill bit that includes a bit body; at least one roller cone rotatably mounted on the bit body; a plurality of cutting elements disposed on the at least one roller cone; and a hardfacing disposed on at least a portion of one of the at least one roller and the plurality of cutting elements, the hardfacing comprising coarse carbide grains disposed in a binder matrix phase, wherein the binder matrix phase comprises nanoparticles dispersed therein.

Other aspects and advantages of the invention will be apparent from the following description and the appended claims.

DETAILED DESCRIPTION

Embodiments disclosed herein relate generally to the use of nano-doping to provide improvements in wear resistance of a carbide material having a given toughness and hardness. In particular embodiments, the present disclosure relates to nano-doping of carbide materials formed from coarse grained carbides. Coarse grained carbides may be defined as carbide grades having average carbide grain sizes greater than 3 microns (μm) and binder contents of 6 to 20% by weight.

While the use of coarse grained carbides have conventionally provided for an increase in fracture toughness, this is usually at the sacrifice of wear resistance. However, embodiments of the present disclosure may allow for substantial improvements in wear resistance while maintaining fracture toughness, resulting in a carbide grade that possesses both improved fracture toughness and wear resistance contrary to the well-established inverse relationship between wear resistance and fracture toughness.

Figure 1:
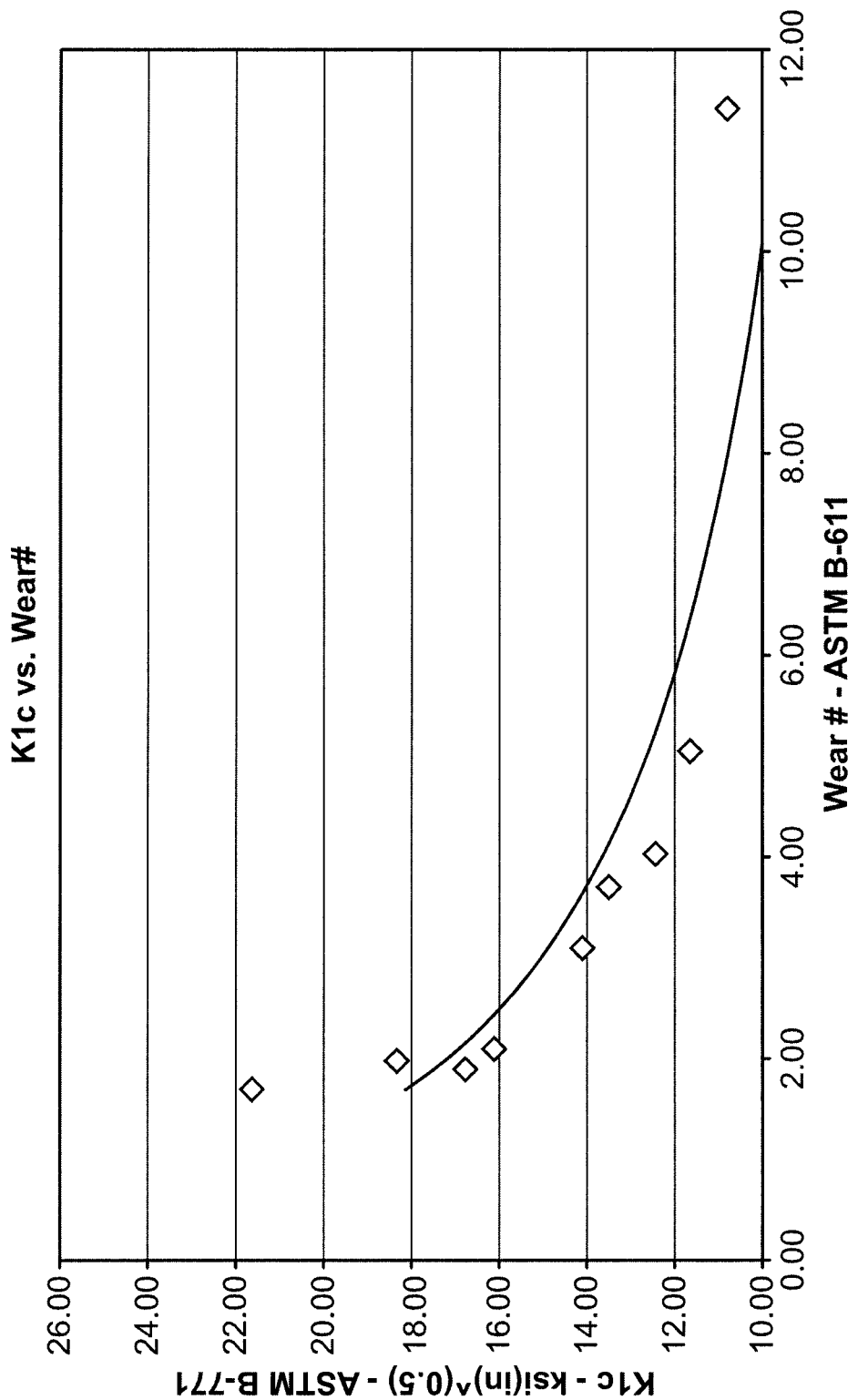
FIG. 1 is a graph showing the relationship between fracture toughness and wear resistance.
Figure 2:
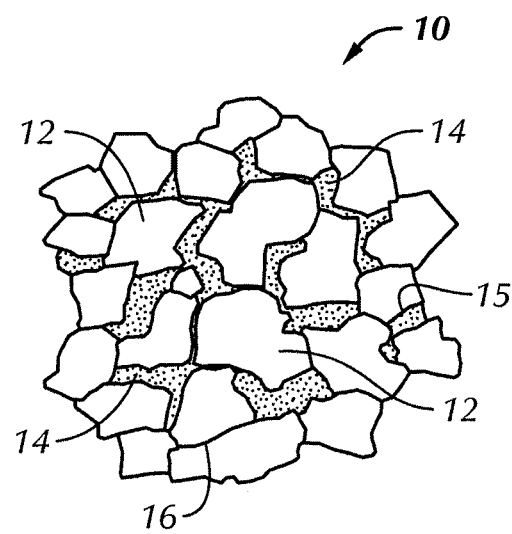
FIG. 2 is a schematic of a WC/Co microstructure.

FIG. 2 illustrates the microstructure of a cemented tungsten carbide according to the present disclosure. As shown in FIG. 1, cemented tungsten carbide 10 includes tungsten carbide grains 12 that are bonded to one another by a metal binder matrix phase 14. As illustrated, tungsten carbide grains may be bonded to other grains of tungsten carbide, thereby having a tungsten carbide/tungsten carbide interface 16, and/or may be bonded to the metal phase, thereby having a tungsten carbide/metal interface 15. The unique properties of cemented tungsten carbide result from this combination of a rigid carbide network with a tougher metal substructure. In accordance with embodiments of the present disclosure, binder matrix phase 14 may include nano-dopants or nanoparticles dispersed therein. The term "nano-dopant" or "nanoparticle" refers to various materials having at least one dimension, such as length or diameter, between 1 and 100 nanometers.

Such nanoparticles may be dispersed in the matrix phase by adding such particles to the binder material prior to formation (sintering) of the carbide composite and/or by precipitation of intermetallics during the sintering. The types of nanoparticles which may be found in the binder matrix phase may include various reinforcing particles of carbide, nitrides, borides, and/or carbonitrides of W, Ta, Nb, Ti, V, Cr, Mo, B, and Zr, as well as intermetallics formed with Ni, Co, and Fe. Further, in particular embodiments, the nanoparticles may be θ-phase particles.

Alternatively, the nanoparticles may include diamond or cubic boronitride particles. Such particles may be provided in the binder material in an amount up to 40 percent by volume of the binder, but preferably between 1 to 10 percent by volume.

To reduce the occurrence of dissolution and/or grain growth of the nanoparticles beyond the "nano" size range, nanoparticles being added to the binder material may have surface functionalization or coating provided thereon. In a particular embodiment, such functionalization may include an ultra-thin conformal coating. As used herein, "ultra-thin" refers to a thickness of less than 100 nm. In a particular embodiment, the ultra-thin coating may have a thickness ranging from about 0.1 to about 50 nm, from about 0.5 to 35 nm in another embodiment, and from about 1 to 10 nm in yet another embodiment. "Conformal" refers to a relatively uniform thickness across the surface of the particle such that the surface shape of a coated particle is substantially similar to that of the uncoated particle. Use of such coated materials may be described in U.S. Patent Publication No. 2008-0073127, which is assigned to the present assignee and herein incorporated by reference in its entirety Depending on the desired application of the carbide composite material and the type of nanoparticles to be coated, the composition of the coatings may vary Such coatings may include a sinterable material including, for example, metals, metal alloys, ceramic materials, and cermets. For example, coatings that may be suitable for use on the nanoparticles of the present disclosure may include metals and binary materials, i.e., materials of the form $Q_xR_y$, where Q and R represent different atoms and x and y are numbers that reflect an electrostatically neutral material. Among the suitable binary materials are various inorganic ceramic materials including oxides, nitrides, carbides, sulfides, fluorides, and combinations thereof. Examples of oxides that may find use in the present disclosure include those such as $CoO$, $Al_2O_3$, $TiO_2$, $Ta_2O_5$, $Nb_2O_5$, $ZrO_2$, $HfO_2$, $SnO_2$, $ZnO$, $La_2O_3$, $Y_2O_3$, $CeO_2$, $Sc_2O_3$, $Er_2O_3$, $V_2O_5$, $SiO_2$, $In_2O_3$, and the like. Examples of nitrides that may find use in the present disclosure include those such as $Si_3N_4$, AlN, TaN, NbN, TiN, MoN, ZrN, HfN, GaN, and the like. Examples of carbides that may find use in the present disclosure include those such as SiC, WC, and the like. Examples of sulfides that may find use in the present disclosure include those such as ZnS, SrS, CaS, PbS, and the like. Examples of fluorides that may find use in the present disclosure include those such as $CaF_2$, $SrF_2$, $ZnF_2$, and the like. Among the suitable metal coatings include Pt, Ru, Ir, Pd, Cu, Fe, Co, Ni, W, and the like. Other types of materials that may be used to form an ultra-thin conformal coating include those described in U.S. Pat. No. 6,613,383, which is hereby incorporated by reference in its entirety. Coatings suitable for use in the present disclosure may also include mixed structures, such as TiAlN, Ti3AlN, ATO (AlTiO), coatings including doped metals, such as ZnO:Al, ZnS:Mn, SrS:Ce, $Al_2O_3$:Er, $ZrO_2$:Y, which may also include other rare earth metals ($Ce^{3+}$, $Tb^{3+}$, etc.) for doping or co-doping, or nanolaminates, such as $HfO_2/Ta_2O_5$, $TiO_2/Ta_2O_5$, $TiO_2/Al_2O_3$, $ZnS/Al_2O_3$, and the like. Further, other inorganic species such as inorganic polymers may be suitable for coatings of the present disclosure, including inorganic polymers such as, for example, polysilanes, polysiloxanes, polystannanes, polyphosphazene, polysulfides, and hybrid polymers of a grafted inorganic and organic polymer.

In a particular embodiment, the coating itself may be a reagent or catalyst that functions as a sintering aid in the formation of a cermet composite. Thus, the ultra-thin coating may provide a high surface area of catalyst or reactive material and/or provide a means for finely dispersing the coated nanoparticles. For example, the nanoparticles of the present disclosure may be coated with a material such as aluminum oxide, which may function as a sintering aid, and which may also exhibit O-phase precipitation hardening.

In a particular embodiment, the ultra-thin, conformal coating of the present disclosure may be applied on the nanoparticles through atomic layer controlled growth techniques or atomic layer deposition (ALD). ALD deposition of coatings is described, for example, in U.S. Pat. No. 6,913,827, which is herein incorporated by reference in its entirety. ALD methods use self-limiting surface chemistry to control deposition. Under the appropriate conditions, deposition may be limited to a small number of functional groups on the surface, i.e., approximately one monolayer or $\sim 1\times10^{15}$ species per $cm^2$. ALD permits the deposition of coatings of up to about 0.3 nm in thickness per reaction cycle, and thus provide a means for controlling thickness to extremely fine thicknesses. In these techniques, the coating may be formed in a series of two or more self-limited reactions, which in most instances can be repeated to subsequently deposit additional layers of the coating material until a desired coating thickness is achieved. In most instances, the first of these reactions may involve some functional group on the surface of the particle, such as an M-H, M-O—H, or M-N—H group, where M represents an atom of a metal or semi-metal. The individual reactions may be carried out separately and under conditions such that all excess reagents and reaction products are removed before concluding the succeeding reaction. The particles may optionally be treated prior to initiating the reaction sequence to remove volatile materials that may have absorbed onto the surface of the particulate materials. This may be readily done by exposing the particles to elevated temperatures and/or vacuum.

Additionally, in some instances a precursor reaction may be performed to introduce desirable functional groups onto the surface of the nanoparticles to facilitate a reaction sequence in creating an ultra-thin coating. Examples of such functional groups include hydroxyl groups, amino groups, and metal-hydrogen bonds, which may serve as a site of further reaction to allow formation of an ultra-thin coating. Functionalization may be achieved through surface treatments including, for example, water plasma treatment, ozone treatment, ammonia treatment, and hydrogen treatment.

Oxide coatings may be prepared on particles having surface hydroxyl or amine (M-N—H) groups using a binary (AB) reaction sequence as follows. The asterisk (*) indicates the atom that resides at the surface of the particle or coating, and Z represents oxygen or nitrogen. $M^1$ is an atom of a metal (or semimetal such as silicon), particularly one having a valence of 3 or 4, and X is a displaceable nucleophilic group. The reactions shown below are not balanced, and are only intended to show the reactions at the surface of the particles (i.e., not inter- or intralayer reactions).

  (A1)

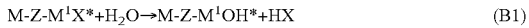  (B1)

In reaction A1, reagent $M^1X_n$ reacts with one or more M-Z—H groups on the surface of the particle to create a "new" surface group having the form -$M^1$X. $M^1$ is bonded to the particle through one or more Z atoms. The -$M^1$X group represents a site that can react with water in reaction B1 to regenerate one or more hydroxyl groups. The groups formed in reaction B1 can serve as functional groups through which reactions A1 and B1 can be repeated, each time adding a new layer of $M^1$ atoms. Atomic layer controlled growth and additional binary reactions are described in more detail in U.S. Pat. No. 6,613,383, which is herein incorporated by reference in its entirety.

A convenient method for applying the ultra-thin, conformal coating to particulate material is to form a fluidized bed of the particles, and then pass the various reagents in turn through the fluidized bed under reaction conditions. Methods of fluidizing particulate material are well known and are described, for example, "Nanocoating Individual Cohesive Boron Nitride Particles in a Fluidized Bed Reactor," Jeffrey R. Wank, et al., Powder Technology 142 (2004)59-69.

If desired, multiple layers of ultra-thin coatings may be deposited on the particulate material. For example, an intermediate ultra-thin layer may be applied to provide a surface to which a desired outer layer can be applied more easily. Where multiple layers of coating are desired, the multiple layers may possess identical compositions, or the multiple layers may vary in composition. It is specifically within the scope of the present disclosure that the multiple layers may include combinations of any of the above described coating compositions such, for example, metal-on-metal, metal-on-oxide, and oxide-on-oxide. One of ordinary skill in the art would recognize that depending on the compositions of the applied coating, during any subsequent sintering conditions, the coating may undergo a number of transitions. For example, an ALD bi-layer of $Al_2O_3/TiO_2$, after sintering, may react and form an aluminum titanate coating. Further, one of ordinary skill in the art would recognize that there is no limitation on the combination or number of layers which may be provided on the particulate material of the present disclosure. It is also specifically within the scope of the present disclosure that a subsequent coating layer may be deposited by a method other than ALD, such as CVD or PVD, for example, on an ALD-deposited coating.

Alternatively, a coating may be applied using atomic layer deposition methods as described above, and the coating may subjected to one or more reactions to form a modified coating. This technique may be used, for example, for creating ultra-thin coatings of various types that are not amenable to deposition using atomic layer deposition techniques. For example, various types of ultra-thin oxide coatings can be formed using the atomic layer deposition techniques described above, and then can be carburized to convert the oxide to the corresponding carbide.

Integration of the nanoparticles into the composite body may include any means as known to those skilled in the art. As used herein, integration refers to any means for adding the nanoparticles to a component of the composite body such that the nanoparticles are a component of the formed composite body, i.e., by dispersion or other forms of incorporation of the nanostructures as known to those skilled in the art. In some embodiments the nanoparticles may be integrated in such a manner so as to achieve a generally uniform dispersion of the nanoparticles through the formed composite body.

For example, in one embodiment, blending of the nanoparticles with a carbide particulate phase or binder particulate phase may be accomplished by any suitable wet mixing technique that will provide a dispersion of the nanoparticles in the binder powder. Typically, a homogenous dispersion, with minimal agglomeration and clumping may be prepared, for example, by dispersing the components, individually or as a mixture, in a mixing medium, such as a low molecular weight alcohol (e.g., ethanol), with an ultrasonic probe, blending the dispersions of the components that are individually dispersed, and evaporating the solvent in an ultrasonic bath. Further, the mixing media may optionally contain a surfactant, as known to those of skill in the art, that may further promote dispersion of the nanoparticles in the binder particulate phase. Further, while reference is made to the wet mixing of the nanoparticles with binder particles, one of ordinary skill in the art would appreciate that the nanoparticles may alternatively be mixed with the carbide powder phase.

Further, dry mixing or mixing with other volatile media may also be used. Mechanical mixing may be performed by ball-milling in conventional rotary mills that mix the powder mixture with the assistance of tumbling balls. The sizes of the balls, the number of balls used per unit volume of powder, the rotation speed of the mill, the temperature at which the milling is performed, and the length of time that milling is continued can all vary widely. Best results may generally be achieved with a milling time ranging from about 4 hours to about 50 hours. The degree of mixing may also be affected by the "charge ratio," which is the ratio of the mass of the balls to the mass of the powder. A charge ratio of from about 5 to about 20 will generally provide proper mixing. The milling may be performed on the powders while suspended in the liquid suspending agent referred to above.

Alternatively, one of ordinary skill in the art would recognize that other means may be used to integrate or incorporate nanoparticles into the composites of the present disclosure, such as, for example, vapor co-deposition (in which the nanostructure material and a particulate phase are sublimed, mixed in the vapor phase, and then condensed on a substrate), spraying coating of particles (either carbide or binder particles) (such as that described in U.S. Patent Publication No. 20030012951, which is herein incorporated by reference in its entirety), infiltration by electromagnetic levitation (such as that described in U.S. Patent Publication No. 2004/0206470, which is herein incorporation by reference in its entirety), extrusion, either high or regular shear, (such as that described in U.S. Patent Publication No. 20040029706, which is herein incorporated by reference in its entirety), or infiltration of a perform (such as that described in U.S. Pat. No. 6,934,600).

The hard particulate carbide phase (on the macroscale) may include carbide particles with average carbide grain sizes greater than 3 microns. In other particulate embodiments, the carbides may range from about 4 to 9 microns, and greater than about 5 microns in yet another embodiment. Further, one skilled in the art would appreciate that a several types of carbide particles exist, including cast, cemented, and macrocrystalline carbide. Any of such particles may be used (depending on the desired application), but in a particular embodiment, macrocrystalline tungsten carbide may be particularly suitable for use in forming cutting elements. Further, while the binder content may generally range from 6 to 20 percent by weight, and to achieve high fracture toughness, a binder content of at least 10 percent by weight may be used.

The composite bodies of the present disclosure may be prepared by a number of different methods, e.g., by various sintering techniques, including HIP and vacuum sintering. HIP, as known in the art, is described in, for example, U.S. Pat. No. 5,290,507, which is herein incorporated by reference in its entirety. Isostatic pressing generally is used to produce powdered metal parts to near net sizes and shapes of varied complexity. Hot isostatic processing is performed in a gaseous (inert argon or helium) atmosphere contained within a pressure vessel. Typically, the gaseous atmosphere as well as the powder to be pressed are heated by a furnace within the vessel. Common pressure levels for HIP may extend upward to 45,000 psi with temperatures up to 3000° C. For tungsten carbide composites, typical processing conditions include temperatures ranging from 1200-1450° C. and pressures ranging from 800-1,500 psi. In the hot isostatic process, the powder to be hot compacted is placed in a hermetically sealed container, which deforms plastically at elevated temperatures. Prior to sealing, the container is evacuated, which may include a thermal out-gassing stage to eliminate residual gases in the powder mass that may result in undesirable porosity, high internal stresses, dissolved contaminants and/or oxide formation.

Vacuum sintering, as known in the art, is described in, for example, U.S. Pat. No. 4,407,775, which is herein incorporated by reference in its entirety. The power to be compacted is loaded in an open mold or container for consolidation. The powder is then consolidated by sintering in a vacuum. Suitable pressures for vacuum sintering are about $10^{-3}$ psi or less. Sintering temperatures must remain below the solidus temperature of the powder to avoid melting of the powder. Further, one of ordinary skill in the art would appreciate that other methods may be used, such as, for example, solid state or liquid phase sintering, pneumatic isostatic forging, spark plasma sintering, microwave sintering, gas phase sintering, hot isostatic pressing inert gas sintering and hot pressing.

Composite bodies of the present disclosure may be used in a number of different applications, such as tools for drilling, including for example, composite bodies for drill bits (and components thereof), where mechanical properties of high fracture toughness, wear resistance, and hardness are highly desired. Specifically, the composite body may be used to form bit bodies and/or other wear and cutting components in such downhole cutting tools as roller cone bits, percussion or hammer bits, and drag bits.

Depending on the type of particulate material used to form the composite, the various composites can be used to form a wear surface in such applications in the form of one or more cutting element components, a wear resistant coating on a bit body, or can be used to form a bit body component itself.

Figure 3:
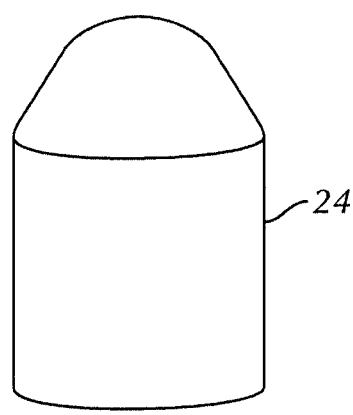
FIG. 3 is a schematic perspective side view of an insert comprising a composite of the present disclosure.
Figure 4:
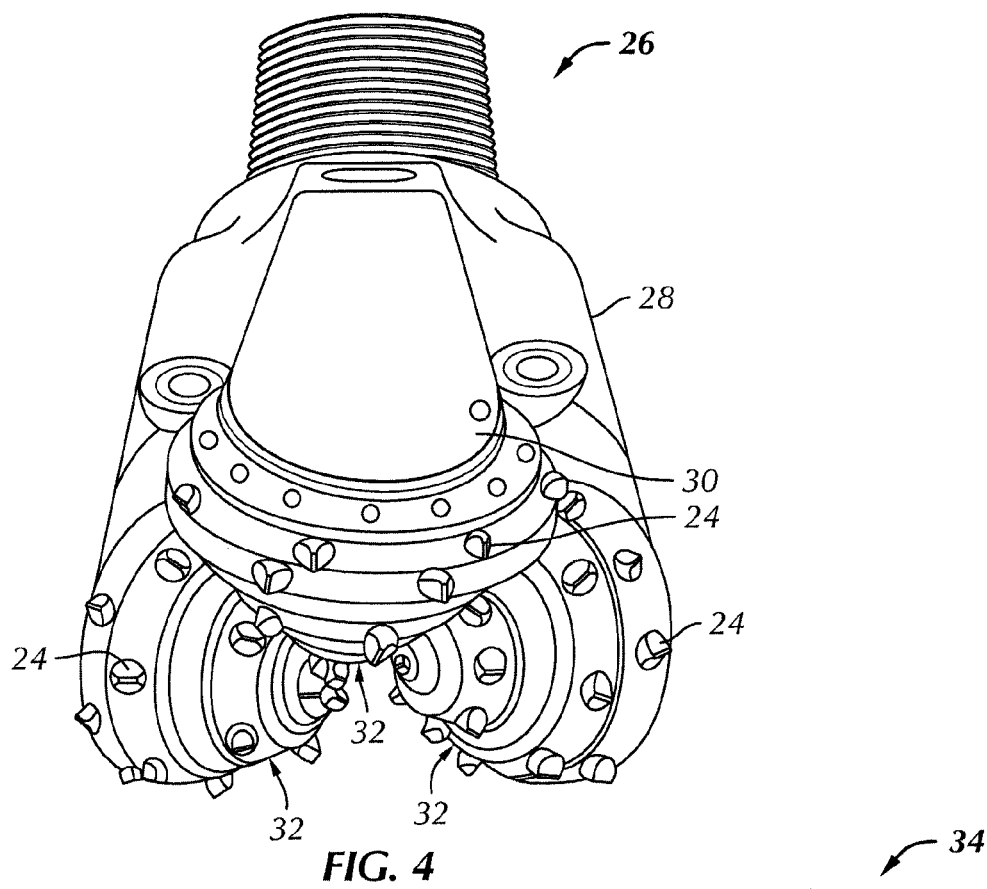
FIG. 4 is a perspective side view of a roller cone drill bit comprising a number of the inserts of FIG. 3.

FIG. 3, for example, illustrates a drill bit insert 24 that is formed from a composite material of the present disclosure. Referring to FIG. 4, such an insert 24 can be used with a roller cone drill bit 26 comprising a body 28 having three legs 30, and a cutter cone 32 mounted on a lower end of each leg. Each roller cone bit insert 24 can be fabricated according to one of the methods described above. The inserts 24 are provided in the surfaces of the cutter cone 32 for bearing on a rock formation being drilled. Additionally, while not shown, a roller cone bit may also be provided with a wear-resistant coating on at least a portion of its surface (frequently referred to as a hardfacing) which may also be formed of the composite materials of the present disclosure.

Figure 5:
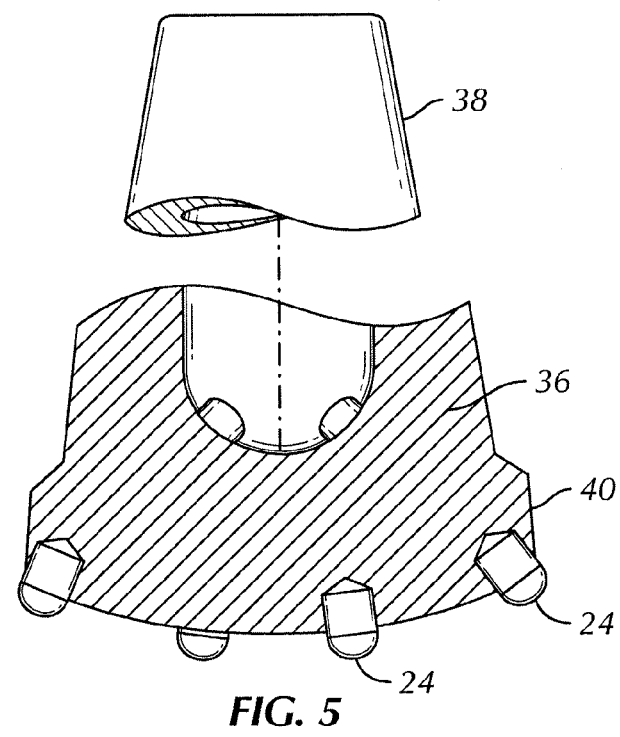
FIG. 5 is a perspective side view of a percussion or hammer bit including a number of inserts comprising a composite of the present disclosure.

Referring to FIG. 5, inserts 24 formed from composites of the present disclosure may also be used with a percussion or hammer bit 34, comprising a hollow steel body 36 having a threaded pin 38 on an end of the body for assembling the bit onto a drill string (not shown) for drilling oil wells and the like. A plurality of the inserts 24 are provided in the surface of a head 40 of the body 36 for bearing on the subterranean formation being drilled.

Figure 6:
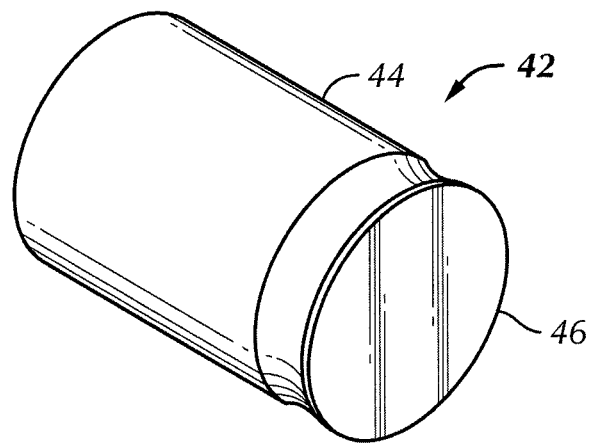
FIG. 6 is a schematic perspective side view of a shear cutter comprising a composite of the present disclosure.
Figure 7:
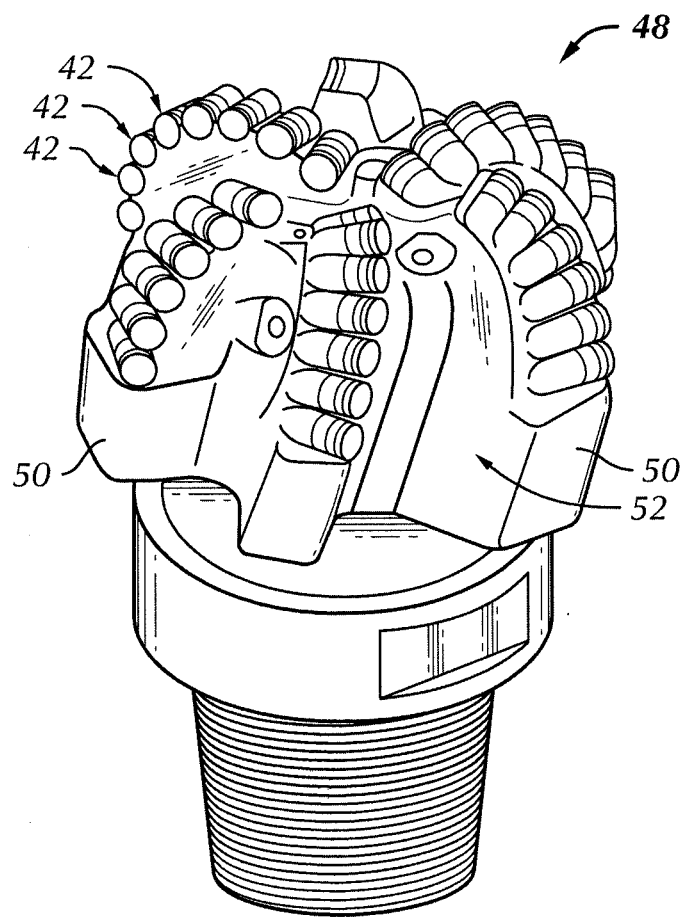
FIG. 7 is a perspective side view of a drag bit comprising a number of the shear cutters of FIG. 6.

Referring to FIG. 6, composites of the present disclosure may also be used to form shear cutters 42 that are used, for example, with a drag bit for drilling subterranean formations. More specifically, composites may be used to form a sintered surface layer 46 on a cutter or substrate 44. Referring to FIG. 7, a drag bit 48 comprises a plurality of such shear cutters 42 that are each attached to blades 50 that extend from a head 52 of the drag bit for cutting against the subterranean formation being drilled. In a particular embodiment, cutters 42 includes a carbide substrate (not shown) formed with reinforcing nanostructures, as disclosed herein, and a diamond cutting face (not shown) attached thereto. One of ordinary skill in the art would recognize that in various embodiments other types of cutting elements (such as inserts 24 shown in FIG. 3) formed from composites of the present disclosure may also be used in drag bit 48.

Figure 8:
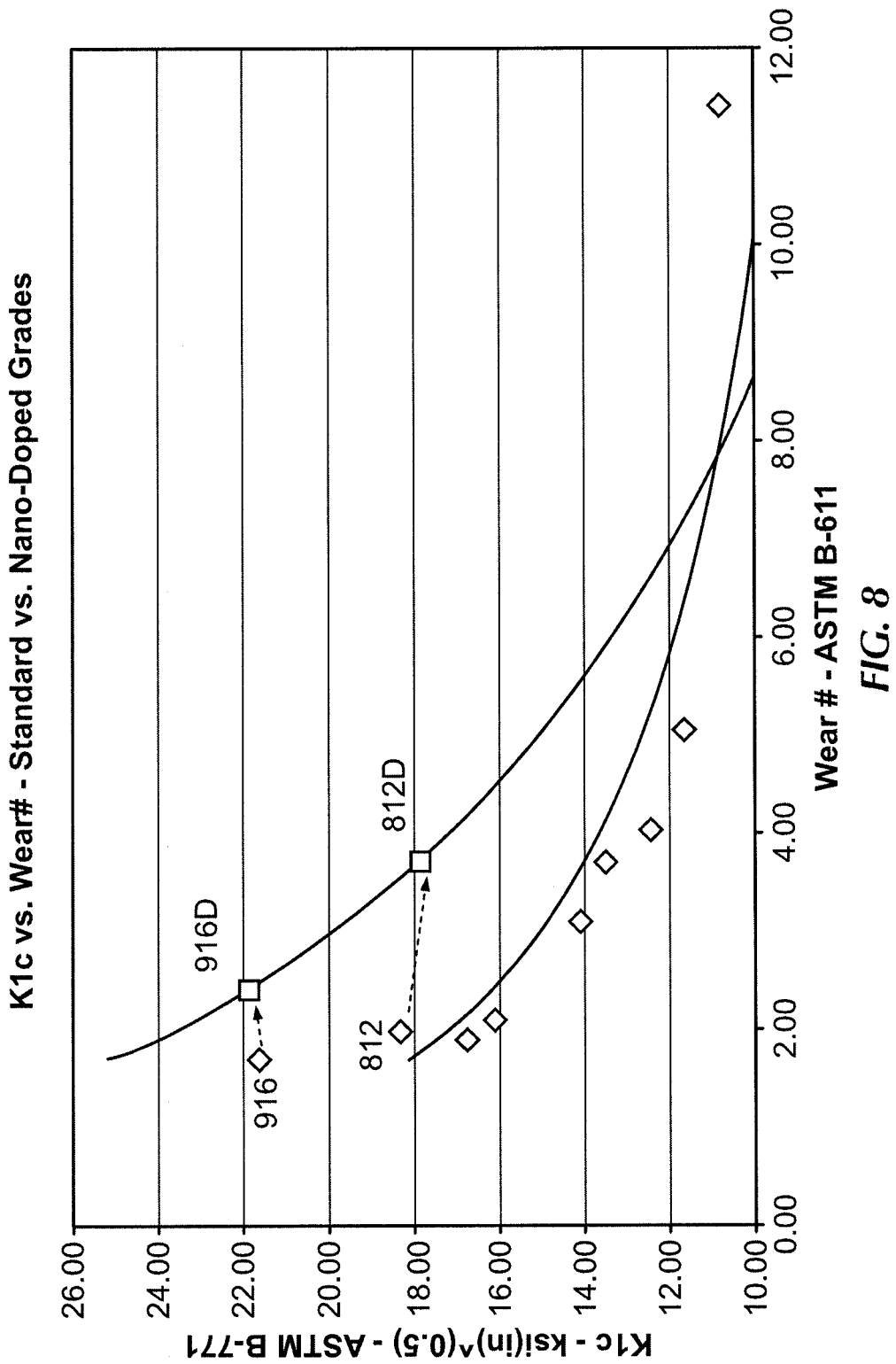
FIG. 8 is a graph showing the relationship between fracture toughness and wear resistance for carbide grades of the present disclosure as compared to conventional, prior art carbide grades.
Figure 9:
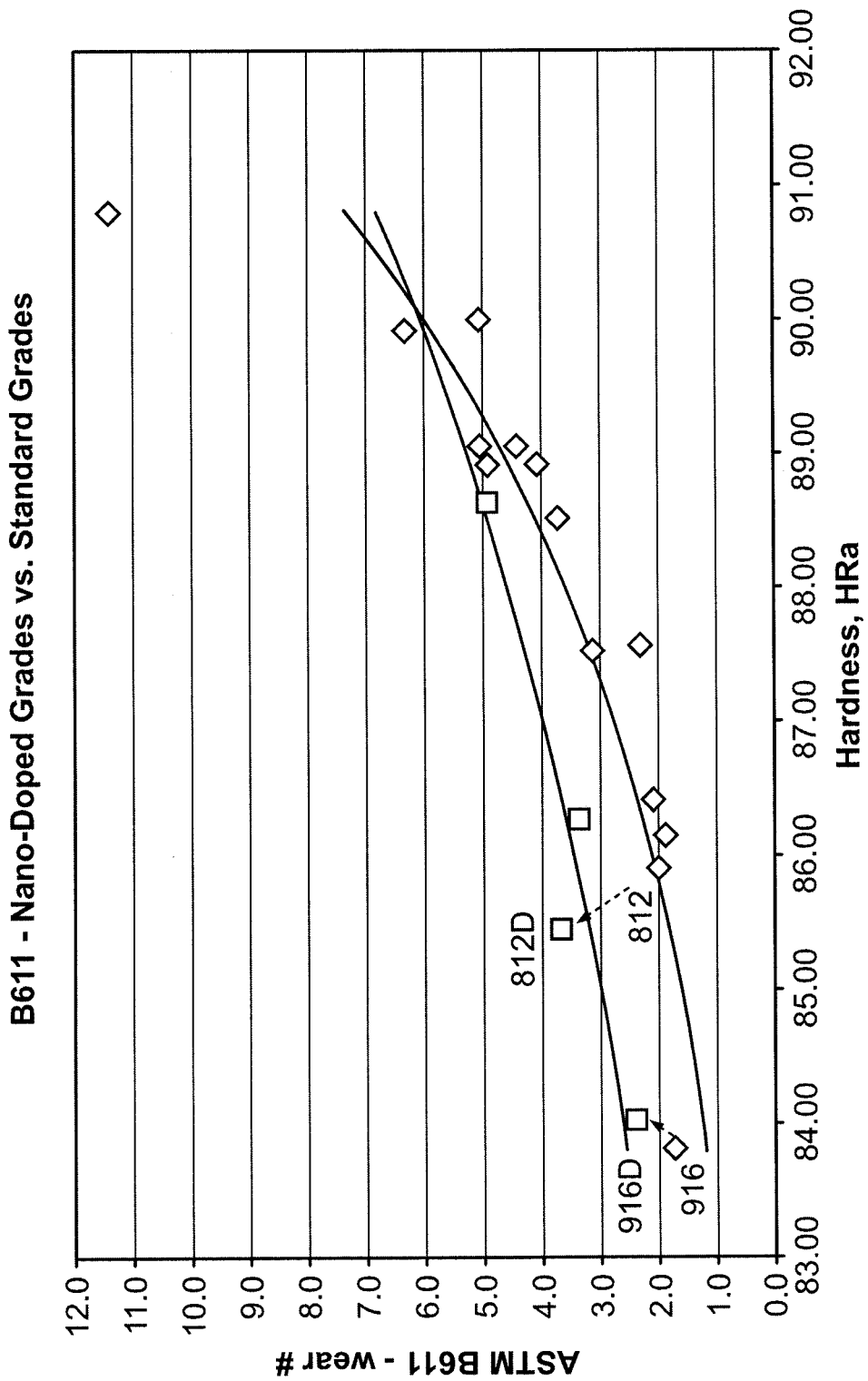
FIG. 9 is a graph showing the relationship between hardness and wear resistance for carbide grades of the present disclosure as compared to conventional, prior art carbide grades.

Incorporation of nanoparticles into the binder matrix phase, as disclosed herein, may provide for a shift in the resulting materials properties. For example, as shown in FIGS. 8 and 9, for a given carbide grade (for example 812 and 916), the wear resistance of the same carbide grade (but with nano-doping, 812D and 916D) may substantially increase without showing substantial change in fracture toughness and hardness. Thus, such shift may allow for doped carbide grades to be used in applications that require greater wear resistance than the conventional coarse carbide grades are able to offer. For example, inner rows of roller cone bit typically use conventional grades such as 510, etc. due to their wear resistance properties. Substitution of such conventional grades for the doped carbides of the present disclosure may allow for the same (or similar) wear resistance as the conventional smaller particle grade but with the fracture toughness of a coarser grade carbide. Conversely, substitution of a conventional coarse grade may allow for the same (or similar) fracture toughness but with the wear resistance of a finer grade carbide. Thus, carbide grades formed in accordance with embodiments of the present disclosure may provide simultaneous achievement of superior insert toughness (and an ability to resist breakage after thermal fatigue cracks have formed) and wear resistance.

Exemplary material properties may include any of: wear numbers ranging from about 2 to about 4, hardness values ranging from about 83 to 89 Rockwell A, and fracture toughness values of at least 18 ksi(in)$^{0.5}$, and at least 21 ksi(in)$^{0.5}$ in other embodiments. Moreover, as discussed above, while conventionally, toughness is achieved at the sacrifice of wear resistance, and vice versa, improvements in both properties may be achieved in accordance with the present disclosure. Thus, as shown in FIG. 8, for a carbide grade material having a fracture toughness of about 20 ksi(in)$^{0.5}$, the material may have a wear number of at least about 2. Additionally, for a fracture toughness of about 17.5 ksi(in)$^{0.5}$, wear number of at least about 3.5 may be achieved. One skilled in the art would appreciate that these values are demonstrative of the characteristics of the carbides of the present disclosure, i.e., that higher wear numbers for a given carbide grade with a given fracture toughness may be achieved than the conventional equivalent grade. Thus, other combinations of fracture toughness and wear would be expected following that same trend. However, in particular embodiments, this improvement in wear resistance may be particularly large for coarser grades (greater than 4 µm average carbide particle size) as compared to finer grades (less than 4 µm average carbide particle size) (i.e., a 40-80% or more improvement in wear numbers as compared to a 10% improvement). Additionally, the magnetic saturation value of the materials may be lowered (at less than 80%) as a result of the nanoparticles, because the matrix phase is likely to increase metal content such as W, with a decreased C content. Such magnetic saturation values may result in better bonding of the carbide to a diamond layer, such as in a PDC cutter.

In general, embodiments of described herein have included a defined cobalt content and an average carbide particle size. Because tungsten carbide disposed in a cobalt matrix is representative of wear-resistant material, the present application has been explained thus far with reference to a WC/Co system. However, it should be understood that embodiments of the invention are not limited to a WC/Co system. In other embodiments, other suitable materials may be used for the coarse grain hard phase particles, including transition metal borides, transition metal carbides, and transition metal nitrides. For example, carbides, borides, or nitrides formed from refractory metals including tungsten (W), titanium (Ti), molybdenum (Mo), niobium (Nb), vanadium (V), hafnium (Hf), tantalum (Ta), chromium (Cr), are specifically considered within the scope of the present invention. Similarly, in other embodiments other suitable binder materials may be used, including cobalt (Co), nickel (Ni), iron (Fe), and alloys thereof.

Embodiments of the present disclosure, therefore, advantageously provide a tough, wear resistant insert for use in rock bits. As a result of this, bits made in accordance with the present invention last longer, meaning fewer trips to change the bit, reducing the amount of rig down time, which results in a significant cost saving. In general, these advantages are realized through selecting appropriate carbide grain size and cobalt content.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed:

1. A down hole drill bit comprising:
a plurality of cutting elements mounted on a cutting structure, wherein at least one of the plurality of cutting elements comprises a wear resistant material, the wear resistant material comprising coarse grains bonded together by a binder matrix phase, wherein the binder matrix phase comprises nanoparticles uniformly dispersed therein, and wherein the coarse grains are selected from the group consisting of transition metal carbides, transition metal borides, and transition metal nitrides, and wherein the nanoparticles comprise intermetallic precipitates formed during formation of the cutting element.

2. The drill bit of claim 1, wherein the coarse grains have an average grain size ranging from 4 to 9 µm.

3. The drill bit of claim 2, wherein the coarse grains have an average grain size greater than 5 µm.

4. The drill bit of claim 1, wherein the nanoparticles comprise particles having a functionalized coating thereon.

5. The drill bit of claim 4, wherein the functionalized coating is applied by atomic layer deposition.

6. The drill bit of claim 5, wherein the nanoparticles comprise $Co_2W_4C$.

7. The drill bit of claim 1, wherein the wear resistant material comprises a wear number of at least about 2.

8. The drill bit of claim 7, wherein the wear resistant material comprises a wear number of at least about 3.

9. The drill bit of claim 8, wherein the wear resistant material is characterized as having a wear number of at least about 3.5 at a fracture toughness of about 17.5 ksi(in)$^{0.5}$.

10. The drill bit of claim 7, wherein the wear resistant material is characterized as having a wear number of at least about 2 at a fracture toughness of about 20 ksi(in)$^{0.5}$.

11. The drill bit of claim 1, wherein the wear resistant material comprises a fracture toughness of at least about 18 ksi(in)$^{0.5}$.

12. The drill bit of claim 11, wherein the wear resistant material comprises a fracture toughness of at least about 20 ksi(in)$^{0.5}$.

13. The drill bit of claim 1, wherein the plurality of cutting elements are mounted on a plurality of blades extending radially from a bit body.

14. The drill bit of claim 1, wherein the plurality of cutting elements are mounted in a plurality of roller cones rotatably mounted on a bit body.

15. The drill bit of claim 1, wherein the nanoparticles comprise up to 40 percent by volume of the binder.

16. The drill bit of claim 15, wherein the nanoparticles comprise between 1 to 10 percent by volume of the binder.

* * * * *